(12) United States Patent
Tzur et al.

(10) Patent No.: US 8,098,948 B1
(45) Date of Patent: Jan. 17, 2012

(54) METHOD, APPARATUS, AND SYSTEM FOR REDUCING BLURRING IN AN IMAGE

(75) Inventors: Meir Tzur, Haifa (IL); Artemy Baxansky, Nesher (IL); Victor Pinto, Zichron-Yaakov (IL)

(73) Assignee: Zoran Corporation, Sunnyvale, CA (US)

( * ) Notice: Subject to any disclaimer, the term of this patent is extended or adjusted under 35 U.S.C. 154(b) by 868 days.

(21) Appl. No.: 12/130,733

(22) Filed: May 30, 2008

Related U.S. Application Data

(60) Provisional application No. 61/016,199, filed on Dec. 21, 2007.

(51) Int. Cl.
*G06K 9/40* (2006.01)

(52) U.S. Cl. ........................ 382/255; 382/264

(58) Field of Classification Search ........... 382/254–275
See application file for complete search history.

(56) References Cited

U.S. PATENT DOCUMENTS

| | | | |
|---|---|---|---|
| 4,975,969 A | 12/1990 | Tal | |
| 5,012,522 A | 4/1991 | Lambert | |
| 5,164,992 A | 11/1992 | Turk et al. | |
| 5,410,609 A | 4/1995 | Kado et al. | |
| 5,450,504 A | 9/1995 | Calia | |
| 6,088,059 A | 7/2000 | Mihara et al. | |
| 6,108,437 A | 8/2000 | Lin | |
| 6,285,799 B1 * | 9/2001 | Dance et al. | 382/261 |
| 6,429,415 B1 | 8/2002 | Rhoads | |
| 6,430,220 B1 | 8/2002 | Determan | |
| 6,567,570 B1 | 5/2003 | Steinle et al. | |
| 6,586,991 B2 | 7/2003 | Masuda et al. | |
| 6,657,566 B1 | 12/2003 | Risbo et al. | |
| 6,657,572 B2 | 12/2003 | Lee et al. | |
| 6,665,338 B1 | 12/2003 | Midya et al. | |
| 7,031,499 B2 | 4/2006 | Viola et al. | |
| 7,061,415 B2 | 6/2006 | Magrath | |
| 7,170,360 B2 | 1/2007 | Braun | |
| 7,206,563 B1 | 4/2007 | Danielson et al. | |
| 7,209,002 B2 | 4/2007 | Ohkuri et al. | |
| 7,224,728 B2 | 5/2007 | Komamura | |
| 7,245,767 B2 | 7/2007 | Moreno et al. | |
| 7,639,896 B2 | 12/2009 | Sun et al. | |
| 7,659,778 B2 | 2/2010 | Vainsencher | |
| 7,684,651 B2 | 3/2010 | Tang et al. | |
| 7,742,239 B2 * | 6/2010 | Bell et al. | 359/737 |
| 7,852,350 B2 | 12/2010 | Barone et al. | |

(Continued)

OTHER PUBLICATIONS

Primot, J. et al., "Deconvolution From Wave-front Sensing: A New Technique for Compensating Turbulence-degraded Images," The Journal of the Optical Society of America, Sep. 1990, 7:1598-1608.

(Continued)

*Primary Examiner* — Jingge Wu

(74) *Attorney, Agent, or Firm* — Frommer Lawrence & Haug LLP; Bruce E. Black

(57) ABSTRACT

A method of processing an image includes obtaining the image; determining a point spread function for the image; applying a filter, based on the point spread function, to at least a portion of the image to form a filtered image; and generating a processed image by blending the filtered image with the image or another filtered image, wherein a first portion of the processed image is generated using a different amount of blending of the filtered image with the image or other filtered image than is used for a second portion of the processed image.

26 Claims, 5 Drawing Sheets

U.S. PATENT DOCUMENTS

| | | | |
|---|---|---|---|
| 2003/0063815 A1* | 4/2003 | Watanabe | 382/255 |
| 2004/0252201 A1 | 12/2004 | Meitav et al. | |
| 2005/0047672 A1 | 3/2005 | Ben-Ezra et al. | |
| 2005/0058361 A1 | 3/2005 | Tajima | |
| 2005/0083517 A1 | 4/2005 | Asad et al. | |
| 2005/0110667 A1 | 5/2005 | Borisavljevic | |
| 2005/0246105 A1 | 11/2005 | Faber et al. | |
| 2005/0285670 A1 | 12/2005 | Ohkuri et al. | |
| 2006/0029291 A1 | 2/2006 | Sun et al. | |
| 2006/0034365 A1 | 2/2006 | Song et al. | |
| 2006/0072657 A1 | 4/2006 | Putzeys | |
| 2006/0098237 A1 | 5/2006 | Steinberg et al. | |
| 2006/0110147 A1 | 5/2006 | Tomita et al. | |
| 2006/0125938 A1 | 6/2006 | Ben-Ezra et al. | |
| 2006/0209292 A1* | 9/2006 | Dowski et al. | 356/121 |
| 2007/0009169 A1 | 1/2007 | Bhattacharjya | |
| 2007/0014554 A1 | 1/2007 | Sasaki et al. | |
| 2007/0058073 A1 | 3/2007 | Steinberg et al. | |
| 2007/0065130 A1 | 3/2007 | Fukumoto et al. | |
| 2007/0104362 A1 | 5/2007 | Hwang et al. | |
| 2007/0122049 A1* | 5/2007 | Dowski et al. | 382/254 |
| 2007/0201732 A1 | 8/2007 | Wahlsten | |
| 2007/0286514 A1* | 12/2007 | Brown et al. | 382/254 |
| 2007/0286517 A1* | 12/2007 | Paik et al. | 382/255 |
| 2008/0203276 A1* | 8/2008 | Dowski et al. | 250/208.1 |
| 2008/0253623 A1 | 10/2008 | Hauke | |
| 2009/0060373 A1* | 3/2009 | Perera et al. | 382/264 |
| 2009/0154823 A1* | 6/2009 | Ben-Ezra et al. | 382/255 |
| 2011/0032392 A1* | 2/2011 | Litvinov et al. | 348/241 |

OTHER PUBLICATIONS

Raskar, Ramesh et al., "Coded Exposure Photography: Motion Deblurring Using Fluttered Shutter," ACM Transactions on Graphics (TOG), Jul. 2006, 25(3):795-804.

Rabie, Tamer F. et al., "Adaptive-neighborhood Image Deblurring," Journal of Electronic Imaging, Oct. 1994, 3 (4):368-378.

Pham, Tuan Q. et al., "Influence of Signal-to-Noise Ratio and Point Spread Function on Limits of Super-Resolution," Image Processing: Algorithms and Systems IV, 2005, SPIE-IS&T vol. 5672, pp. 169-180.

Neyt, Xavier et al., "Directionally Adaptive Image Resolution," 1996, 5 pages.

Lagendijk, Reginald L. et al., "Basic Methods for Image Restoration and Identification," Feb. 15, 1999, 25 pages.

Gonzalez, R. C. et al., Digital Image Processing Second Edition (Addison-Wesley Publishing Company: Reading, MA) 1987, pp. 334-338.

Farsiu, Sina et al., "Robust Shift and Add Approach to Super-Resolution," International Symposium on Optical Science and Technology, SPIE, Aug. 2003, San Diego, CA, 5203:121-130.

Ben-Ezra, Moshe et al., "Motion Deblurring Using Hybrid Imaging," (Computer Science Department, Columbia University, New York, NY) IEEE 2003, 8 pages.

Ben-Ezra, Moshe et al, "Motion-Based Motion Deblurring," IEEE Transactions on Pattern Analysis and Machine Intelligence, Jun. 2004, 26(6):689-698.

Banham, Mark R. et al., "Digital Image Restoration," IEEE Signal Proccessing Magazines, Mar. 1997, 24-41.

Pascual, C. et al., "High-Fideliy PWM Inverer for Audio Amplificaion Based on Real-Time DSP," Univesiy of Illinois, Jun. 19, 2002, pp. 1-32.

Hawksford, M. "Modulation and System Techniques in PWM and SDM Switching Amplifiers," J. Audio Eng. Soc. vol. 54, No. 3, Mar. 3, 2006, pp. 107-139.

Hawksford, M. O. J., "Time-Quantized Frequency Modulation, Time-Domain Dither, Dispersive Codes and Parametrically Controlled Noise Shaping in SDM," J. Audio Eng. Soc., vol. 52, Jun. 6, 2004, pp. 587-617.

Trehan, C., "High Performance Class-D Amplifiers," Texas Tech University, May 2007, pp. 1-152.

Kiss, P. et al., "Stable High-Order Delta-Sigma Digital-to-Analog Converters," IEEE Transactions on Circuits and Systems: Regular Papers, vol. 51, No. 1, Jan. 2004, pp. 200-205.

Lui, C. et al., "Kullback-Leibler Boosting," Computer Vision and Pattern Recognition, 2003, Proceedings 2003 IEEE Computer Society Conference, vol. 1, Jun. 18-20, 2003, pp. I-587-I-594.

Coetzee, "Correcting Kullback-Leibler Distance for Feature Selection," Journal Pattern Recognition Letters, vol. 26, No. 11, Aug. 2005.

Chung, A. C. S. et al., "Kulti-Modal Image Registration by Minimising Kullback-Leibler Distance," T. Dohi and R. Kikinis (Eds.): MICCAI 2002, LNCS 2489, 2002, pp. 525-532.

Gupta, A. et al., "Computational Models for Object Detection and Recognition," May 2004, 12 pages.

Papageorgiou, C. P. et al., "A General Framework for Object Detection," Sixth International Conference on Computer Vision, 1998, pp. 555-562.

Pilpre, A., "Self-* Properties of Multi Sensing Entities in Smart Environments," Thesis Submitted May 6, 2005 for the degree of Master of Science, Massachusetts Institute of Technology, Jun. 2005.

Viola, P. et al., "Robust Real-time Face Detection," International Journal of Computer Vision, 2005, 57(2):137-154.

Official Communication for U.S. Appl. No. 12/186,232 mailed Nov. 16, 2009.

Official Communication for U.S. Appl. No. 12/130,704 mailed Sep. 20, 2011.

Official Communication for U.S. Appl. No. 12/130,993 mailed Jul. 15, 2011.

\* cited by examiner

METHOD, APPARATUS, AND SYSTEM FOR REDUCING BLURRING IN AN IMAGE

CROSS REFERENCE TO RELATED APPLICATIONS

This application claims the benefit of U.S. Provisional Application No. 61/016,199 filed Dec. 21, 2007, herein incorporated by reference in its entirety.

FIELD

The present invention is directed to methods, apparatuses, and systems for processing images. The present invention is also directed to methods, apparatuses, and systems for processing images to reduce or eliminate blurring.

BACKGROUND

Digital cameras have become ubiquitous and can be used to take both still images and video images. The resolution of these cameras has increased dramatically. Moreover, digital cameras have been incorporated into a variety of devices with other functions such as, for example, mobile phones, personal data assistants (PDAs), and portable computers. A person using a camera, or other camera-containing device, will often take pictures while holding the device, rather than using a tripod or placing the camera on a stable surface. The motion of the camera while the shutter is open and the camera is capturing the image can result in a blurred image. There are other sources of blurring including, for example, imperfect lenses or other optical components and movement of the objects in the image. It is often desirable to reduce or eliminate noticeable blurring in the image.

A number of different methods have been developed to reduce blurring. For example, image capture exposure time may be reduced, at the expense of the signal-to-noise ratio (SNR) to reduce blurring. In another method, multiple images are captured sequentially and the image have the smallest perceived blur is selected. Such a selection can be made using an algorithm or based on the amount of motion detected by a motion sensor in the camera. In another method, an optical stabilization system, often used in conjunction with a motion sensor, moves the image photo sensor or the lens based on motion of the camera.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the present invention is directed toward filtering an image to reduce blurring and then blending the original image with the filtered image to provide a processed image. The amount of blending of the original image with filtered image is different for different portions of the processed image. For example, in at least one embodiment the filtered image (or a blend with a relatively high ratio of the filtered image to the original image) can be used where there are edges of objects in the image. This is where blurring will be most noticeable. The original image (or a blend with a relatively high ratio of the original image to the filtered image) may be used for portions of the image away from the edges of objects, where blurring will not be as noticeable. Such an arrangement may be preferable to using the filtered image because of artifacts arising from the filtering process.

Reduction of Blurring in an Image

Figure 1:
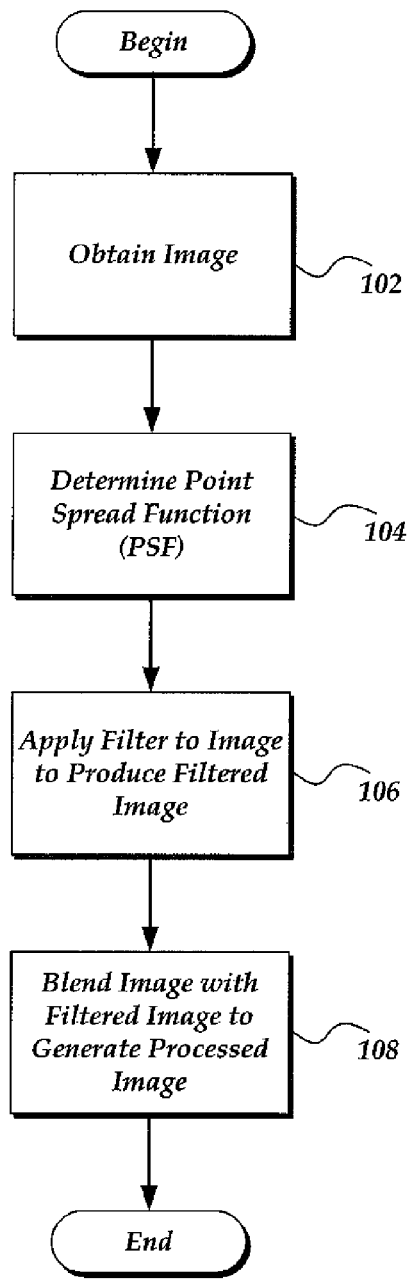
FIG. 1 is a flowchart illustrating one embodiment of a method of reducing blurring in an image, according to the invention.

FIG. 1 illustrates one embodiment of a method of reducing blurring in an image. First, the image is obtained (step 102), for example, from a camera or any other suitable image-taking device or from any other source of images. A point spread function (PSF) is then determined for the image, or a portion of the image (step 104). A filter, based on the PSF, is applied to the image to produce a filtered image (step 106). The original image and the filtered image are then blended to generate the final processed image (step 108). The steps of the methods disclosed herein can be performed by the camera, or the image can be provided to another device (e.g., a computer) that processes the image, or the image can be partially processed by the camera and partially processed by another device.

In step 102, an image is obtained. In general, any camera can be used to capture the image. The image can be captured as a digital image or converted into a digital image. The camera can be still image camera or a video camera (or a combination thereof) and the image can be a still image or a video image. For video images, each frame can be processed individually using the methods disclosed herein or individual frames can be selectively processed. Moreover, video image frames may be processed using the methods described herein to generate a still image from one or more video image frames.

In at least some embodiments, the image is captured along with one or more capture parameters, such as information from a motion detector (e.g., one or more gyroscopes) in the camera. Optical parameters associated with the camera can also be capture parameters. For example, the optical zoom or effective focal length of the camera can be a capture parameter. For the same angular velocity of rotation, the blur extension is often proportional to the optical zoom.

The capture parameters can be used in the process of reducing blurring in the image. For example, one or more gyroscopes can be used to track the motion of the camera lens during the period that the image is captured and the information generated by the gyroscopes can be used to reduce blurring.

In step 104, a PSF is determined for the image or one or more portions of the image. Calculation techniques for PSFs are also known. Any suitable PSF can be used. In at least some embodiments, coefficients of the PSF may be zeroed to reduce the size of the PSF.

As an example, the influence of the PSF can have the form:

$$I_o(i,j) = H(i,j) * I(i,j) + n(i,j)$$

where $I_o(i,j)$ corresponds to the blurred image at pixel $(i,j)$; $I(i,j)$ is the unblurred image at pixel $(i,j)$; $H(i,j)$ is the PSF which is convolved with $I(i,j)$; and $n(i,j)$ is the noise. In at least some embodiments, the information from the motion sensor 664 (e.g., the one or more gyroscopes) in the camera 600 (see FIG. 6) or other capture parameters (including any combination of these parameters and information) can be used in choosing, determining, or calculating the PSF. Techniques such as blind deconvolution might be used without capture parameters.

In at least one embodiment, the PSF can be determined from information generated by gyroscopes that are sampled intermittently, for example, using an A/D convertor. $Gyro_x[i]$ and $Gyro_y[i]$, $i=1, \ldots, N$, denote the gyro readings measuring the angular velocity along the x- and y-axes, respectively, where N is the number of samples during the exposure time. The gyro readings can be converted into the translational velocity of an image point in the sensor plane:

$$v_x[i] = \frac{Gyro_y[i] - Offset_y}{S} \cdot f$$

-continued $$v_y[i] = \frac{Gyro_x[i] - Offset_x}{S} \cdot f$$

where $v_x[i]$ and $v_y[i]$ are the x- and y-components of the velocity of an image point, S is a parameter proportional to the sensitivity of the gyros, f is the optical zoom of the camera (i.e., the effective focal length), and $Offset_x$ and $Offset_y$ are the bias offsets of the x- and y-gyros (i.e. the values measured when the gyros are not rotating about their sensitive axes.) Values for S, $Offset_x$, and $Offset_y$ can be determined or can be estimated.

With the sampling interval represented by dt, if an image point with intensity I spends time dt at pixel [n,m], it contributes I*dt to the pixel value. In at least one embodiment, given the gyroscope information, a PSF, H[n,m], can be calculated as follows (using pseudocode):

Initialization:
H[n,m]=0 for all n,m;
x=0;
y=0;
for (i=1; i<=N; i++) {
x=x+$v_x$[i]·dt;
y=y+$v_y$[i]·dt;
m=round(x);
m=round(y);
H[n,m]=H[n,m]+dt;
}

If a third gyro measuring the angular velocity along the z-axis (which is perpendicular to the sensor plane) is used, the PSF may be space dependent.

In some embodiments, more than one PSF may be determined. In some of these embodiments, each of the PSFs can be associated with different portions of the image. In other embodiments, two or more PSFs (e.g., PSFs with a different number of coefficients zeroed) may be determined for the same image or portion(s) of an image.

Once the PSF is determined, an adaptive deblurring filter, based on the calculated PSF, can be applied to the image (or to one or more portions of the image). In at least some embodiments, the selection of a filter may also be based on the signal-to-noise ratio of the image.

Examples of suitable filters include the Wiener filter, the Lucy-Richardson filter, the inverse filter, the pseudoinverse filter, the regularized filter, and the like. As an example, the 2D Fourier transform of the Wiener filter, $H_w(u,v)$ can be written as:

$$H_w(u, v) = \frac{H^*(u, v) \cdot P_I(u, v)}{|H(u, v)|^2 \cdot P_I(u, v) + P_n(u, v)}$$

where $P_I(u,v)$ and $P_n(u,v)$ are the power spectral densities of the unblurred image and the noise, respectively, $H(u,v)$ is the 2D Fourier transform of the PSF, and $H^*(u,v)$ is the complex conjugate of $H(u,v)$. It will be recognized that in some embodiments more than one filter can be used. The different filters can be applied to different portions of the image (e.g., a different filter might be used for faces) or multiple filters can be applied to the entire image or the same portions of the image. In these latter embodiments, there may be more than one filtered image generated.

In addition, one or more other filters may be applied before or after applying a filter based on the PSF. These filters may be used to alter features of the image data. For example, the non-linear mapping Y=f(X) may be performed on pixel values prior to applying a filter based on the PSF. The pixel values can be, for example, the luminance values, but other domains are also possible. In at least some embodiments, the mapping $f^{-1}$, which is inverse to f, may be performed on the image after filtering with the filter that is based on the PSF, as described above.

In at least some embodiments, the non-linear mapping stretches some portions of the pixel range and shrinks other portions. As examples, a mapping $f_1$ stretches the dark part of the pixel range and shrinks the bright part and a mapping $f_2$ stretches the bright part of the pixel range and shrinks the dark part. Applying $f_1$ to an image (or portion of an image), on one hand, may reduce the influence that bright pixels exert on neighboring dark pixel, but on the other hand, amplify the influence that dark pixels exert on neighboring bright pixels. Consequently, the filtered image may have fewer artifacts in dark areas, but more artifacts in bright areas. Applying $f_2$ to an image (or portion of an image), on one hand, may reduce the influence that dark pixels exert on neighboring bright pixel, but on the other hand, amplify the influence that bright pixels exert on neighboring dark pixels. Consequently, the filtered image may have fewer artifacts in bright areas, but more artifacts in dark areas. In at least one embodiment, the mapping corresponding to $f_1$ is used in dark areas near edges, whereas the mapping corresponding to $f_2$ is used in bright areas near edges. A specific example of mappings $f_1$ and $f_2$ is the inverse gamma correction with different values of gamma (gamma being, for instance, 1 for $f_1$ and 0.5 for $f_2$).

Once the filtered image, F(i,j) is obtained, the image can be processed by blending the filtered image F(i,j) with the original image I(i,j) to generate a processed image O(i,j). In at least some embodiments, the blending can be achieved according to the following equation:

$$O(i,j)=\alpha(i,j)\cdot F(i,j)+(1-\alpha(i,j))\cdot I(i,j)$$

where O(i,j) is the processed image and α(i,j) is a blending factor that has a value ranging from 0 to 1. It will be recognized that this equation assumes a maximum blending factor that is normalized to a value of 1. Maximum blending factors other than 1 can also be used and the blending equation modified accordingly.

Preferably, the blending factor is not the same for all portions of the image. In particular, the value of the blending factor for each pixel may depend on characteristics of that pixel or on characteristics of the image near the pixel. As an example, the blending factor may depend on whether blurring of the pixel and its surrounding will be noticeable to a viewer.

The value of the blending factor for a particular pixel may depend on, for example, one or more of the following: a) whether the pixel is near an edge of an object in the image or on the distance of the pixel from an edge of an object in the image; b) the value of a pixel or the average value of a neighborhood of a pixel; in particular, its closeness to the saturation or the cut-off thresholds for the image; c) for a pixel near an object edge, the contrast of the object edge (e.g., the difference between the maximum and the minimum values on the two sides of the edge); d) the characteristic feature size in a neighborhood of a pixel; e) the object type (e.g., it may be preferable to increase sharpness particularly for faces) or type of texture (e.g., color).

The term "object" in this context can also refer to identifiable portions of a larger object, for example, a pattern (e.g., a stripe or design) on a piece of clothing. The impact of blurring is often greater near the edges of objects in the image and so a higher blending factor (corresponding to weighing the filtered image more in the blending) can be desirable. In areas that are impacted less by blurring, such as areas away from object edges, a lower blending factor can be used. In these embodiments, filtering is used to reduce blurring where the blurring is most noticeable, at the edges of objects in the image; and filtering is not used (or used to a lesser degree) in regions where blurring is acceptable. The object is to reduce the artifacts generated by the filtering process, as compared to an image that is entirely filtered. Accordingly, in one embodiment, the more "edgy" the area around a pixel, the closer the blending factor is to 1 and the "flatter" the area around the pixel, the closer the blending factor is to 0.

In at least some embodiments the closer that a pixel is to an edge of an object in an image, the closer the blending factor is to 1. The blending factor may be selected as a linear or non-linear function of the distance from an object edge. This linear or non-linear function may be continuous or may take on discrete values corresponding to a plurality of threshold distance conditions. As an example, in one embodiment, a pixel near an edge of an object may have a the blending factor in the range of, for example, 0.7 to 1, 0.8 to 1, 0.9 to 1, 0.95 to 1, or even just 1. For pixels that are further from the edge, the blending factor may be in the range of, for example, 0 to 0.8 or 0 to 0.6 or 0 to 0.5 or 0 to 0.2 or even just 0 or in the range of, for example, 0.2 to 0.7 or 0.3 to 0.6 or 0.4 to 0.6 or even just 0.5.

In at least some embodiments, the blending factor is selected from two or more fixed values depending on the distance from edges of objects in the image. In one embodiment, the blending factor has a first value if the pixel is within a threshold distance from any object edge and has a second value otherwise. For example, the first value can be 0.8, 0.9, 0.95, or 1 and the second value can be 0.2, 0.1, 0.05 or 0. In one embodiment, the blending factor is either 0 or 1. If a pixel is less than a threshold distance from an edge of an object in the image, then the blending factor is 1; otherwise, the blending factor is 0.

There are a variety of known methods to detect object edges in an image and determine a distance from such edges. Any suitable method can be used. In at least some embodiments, a neighborhood around a pixel can be investigated to determine if there is an object edge in the neighborhood.

As a non-limiting example, a gradient-based method, such as the Sobel edge detector (see, for example, R. C. Gonzalez and P. Wintz, *Digital Image Processing*, Addison-Wesley, 1987, pp. 334-338, incorporated herein by reference) or the like can be used to determine whether a pixel is sufficiently near an edge or not. To this end, a neighborhood of the pixel is considered, and one or more absolute differences between pixels of the blurred image within the neighborhood are calculated and compared to a threshold value.

The differences in pixel values can be calculated in one or more directions. Preferably, differences are calculated in at least two, three, or four directions. As an example, in at least some embodiments, the differences are calculated within the neighborhood in four directions: horizontal, vertical, and at two 45 degree diagonals between the horizontal and vertical directions. Other selections of differences to be calculated can also be used. In addition, more than one difference can be calculated in the same direction and averaged to reduce the impact of noise. If a difference in at least one of those four directions exceeds a selected threshold value Th, the pixel is classified to be near an edge. It will be recognized that other criteria may be used such as requiring two, three, or four differences to exceed the threshold value.

In at least some embodiments, the distance between the pixels whose differences are calculated is chosen to be at or near the effective size of the PSF in the corresponding direction. That is, the larger the blur extension of the PSF in a given direction, the longer the distance over which the difference between pixels is evaluated in that direction. One possibility is to define the effective size of the PSF using the moments K of the PSF around each one of the four directions (x, y, x/y, and x/−y) as given by the following equations:

$$K_x = \sum_{x,y} |x| \cdot H(x, y)$$

$$K_y = \sum_{x,y} |y| \cdot H(x, y)$$

$$K_{diag1} = \sum_{x,y} \left|\frac{x+y}{2}\right| \cdot H(x, y)$$

$$K_{diag2} = \sum_{x,y} \left|\frac{x-y}{2}\right| \cdot H(x, y)$$

where H(x,y) is the PSF filter. In at least some embodiments, the effective size of the PSF filter corresponds to at least one of the moments. In at least some embodiments, the effective size of the PSF filter in each direction corresponds to the moment in that direction.

A variety of methods can be used to determine the threshold value Th to which the pixel differences are compared. The threshold value may be selected by an algorithm or selected manually. Selection of the threshold value by algorithm may include one or more factors such as the average values of pixels in the image, a portion of the image, or the neighborhood of the pixel in question; the signal-to-noise ratio of the image, a portion of the image, or the neighborhood of the pixel in question; a level set by the user; and the like. In at least some embodiments, the value of the threshold for edge determination can depend on the average value of the pixels in the neighborhood of the pixel under consideration and, optionally, on the noise level of the image which is often, in turn, a function of the average pixel value. In at least some embodiments, the higher the noise value, the higher the threshold. The threshold may also depend on a working point (such as ISO gain) or may be determined by a calibration process.

As another example, the variance of pixels within a neighborhood can be determined. If the variance exceeds a threshold value, then the pixel is near an object edge.

Additional processing may be performed prior to determining the blend factor for each pixel. For example, this processing may filter out noise produced in the edge detection procedure. Examples of suitable processing operations include, but are not limited to, morphological filtering, median filtering, and low-pass filtering.

Figure 2:
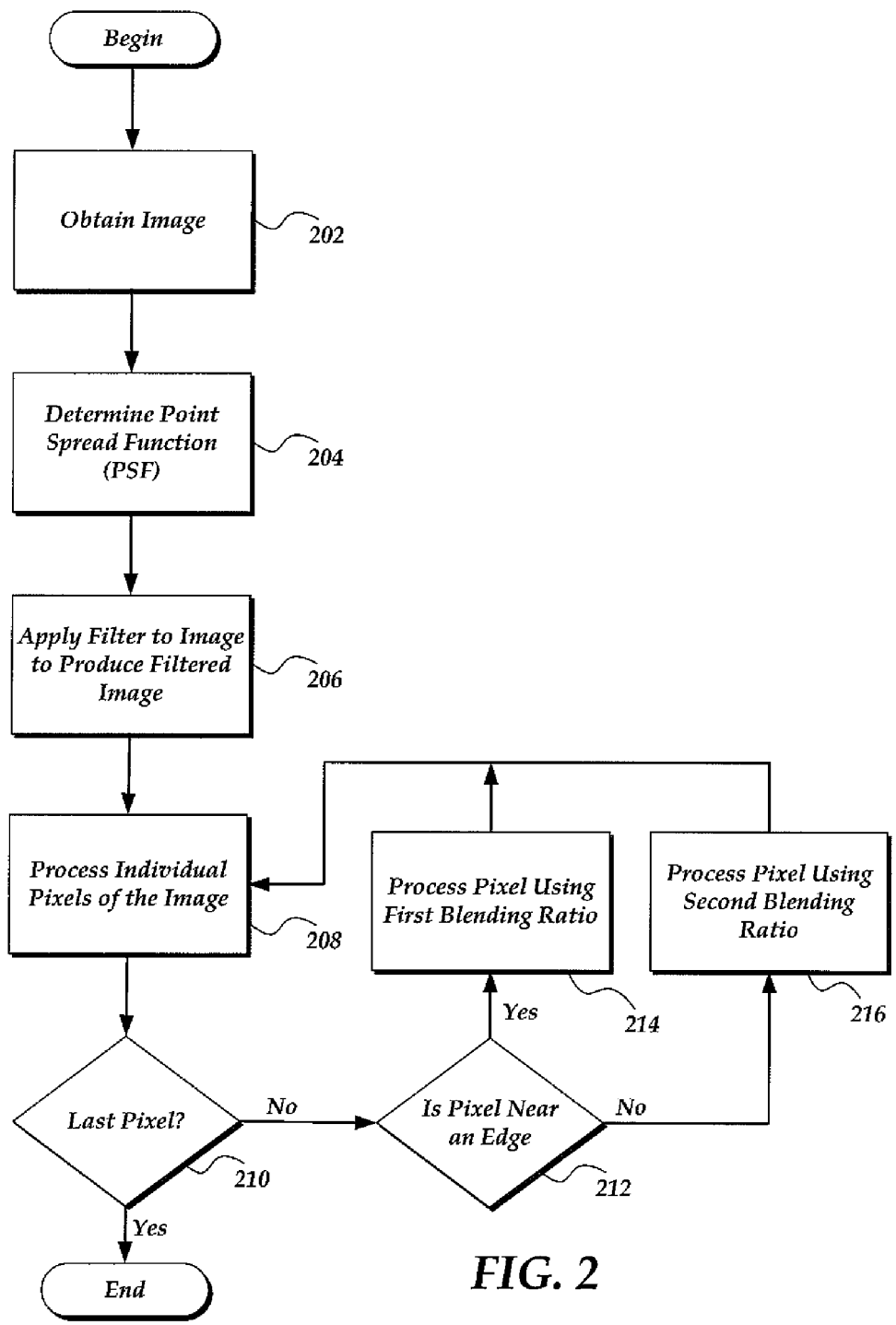
FIG. 2 is a is a flowchart illustrating a second embodiment of a method of reducing blurring in an image, according to the invention.

FIG. 2 is a flow chart for one embodiment of a method of reducing blurring in an image that uses edges to determine blending factors. In this method, the image is obtained in step 202, a PSF is calculated for the image (or one or more portions of the image) in step 204, and then a filter is applied to the image (or one or more portions of the image) based on the PSF to produce a filtered image in step 206. Each pixel of the image is processed in step 208 and it is determined if all the pixels have been processed in step 210. For each pixel, it is determined whether the pixel is near (e.g., within a threshold distance) an edge of an object in step 212. If the pixel is near an edge of an object then the pixel is processed using a first blending ratio to combine the filtered and original image based on the first blending ratio in step 214. If the pixel is not near an edge of an object then the pixel is processed using a second blending ratio to combine the filtered and original image based on the second blending ratio in step 216. The determination of which blending ratio is to be used is made for each pixel. Alternatively, the determination can be made collectively for groups of pixels (e.g., pixel neighborhoods.)

Figure 3:
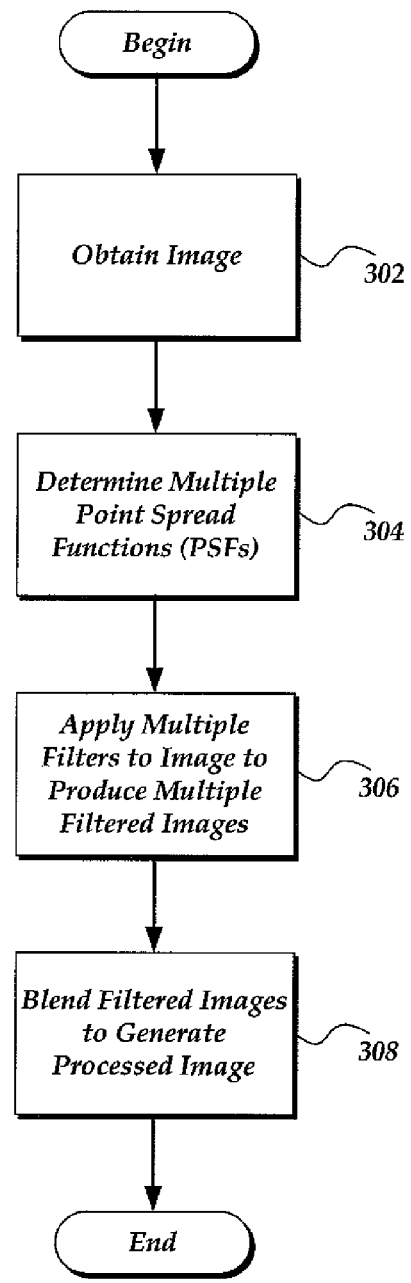
FIG. 3 is a is a flowchart illustrating a third embodiment of a method of reducing blurring in an image, according to the invention.

Although the discussion above has been directed primarily to using a single PSF, single filter, and single blending factor, it will be recognized that the methods can be adapted to use multiple PSFs, multiple filters, multiple blending factors, or any combination thereof. FIG. 3 illustrates one method for using multiple PSFs and multiple filters. First, the image is obtained (step 302) from a camera or any other suitable image-taking device. Multiple point spread functions (PSFs) are then determined for the image, or portions of the image (step 304). Multiple filters, based on the PSFs, are applied to the image, or portions of the image, to produce multiple filtered images (step 306). Alternatively, a single PSF is determined and multiple filters can be used with the same PSF. The filtered images are then blended to generate the final processed image (step 308). For example, the blending may be preformed according to the following equation:

$$O(i,j) = \alpha(i,j) \cdot F_1(i,j) + (1 - \alpha(i,j)) \cdot F_2(i,j)$$

where O(i,j) is the processed image, $F_1(i,j)$ is a first filtered image, $F_2(i,j)$ is a second filtered image, and α(i,j) is a blending factor that has a value ranging from 0 to 1. As indicated above, the blending factor is preferably different for different regions of the image. Optionally, the original image may also be blended with the filtered images.

In embodiments with more than one filtered image or more than one filtered portion of an image, there may be multiple blending factors to allow blending of the multiple filtered images (or portions of an image) with the unfiltered image. The blending factors then correspond to the weighting of each filtered image and the original image. As an example, the following blending equation could be used to blend two filtered images with an original image:

$$O(i,j) = \alpha(i,j) \cdot F_1(i,j) + \beta(i,j) \cdot F_2(i,j) + (1 - \alpha(i,j) - \beta(i,j)) \cdot I(i,j)$$

where O(i,j) is the processed image, $F_1(i,j)$ is a first filtered image, $F_2(i,j)$ is a second filtered image, I(i,j) is the original image, and α(i,j) and β(i,j) are blending factors with 0≦α(i,j)+β(i,j)≦1. Again, the values of the blending factors are preferably different for different regions of the image. It will be recognized that any number of blending factors and filtered images can be used.

Figure 4:
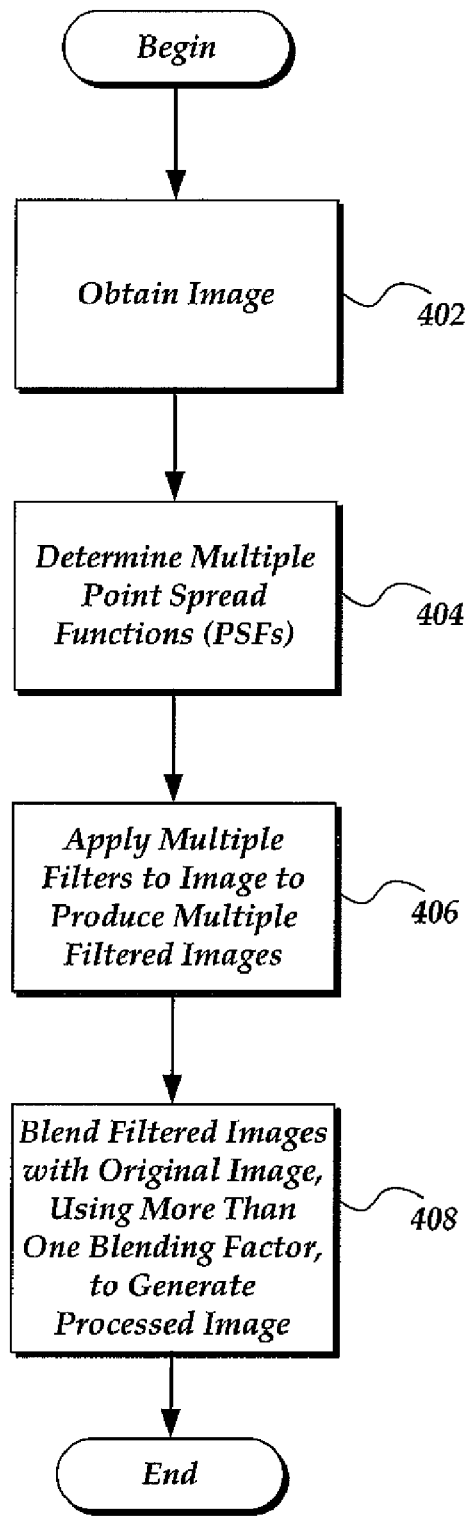
FIG. 4 is a is a flowchart illustrating a fourth embodiment of a method of reducing blurring in an image, according to the invention.

FIG. 4 illustrates one method of processing an image using multiple blending factors. First, the image is obtained (step 402). Multiple point spread functions (PSFs) are then determined for the image, or a portion of the image (step 404). Filters, based on the PSFs, are applied to the image to produce multiple filtered images (step 406). The original image and the multiple filtered images are then blended, using more than one blending factor, to generate the final processed image (step 408). Alternatively, or additionally, different filters can be used with a single PSF or with multiple PSFs to produce the multiple filtered images.

The filters may be based on the same PSF or different PSFs. In addition, some filters are better at reducing blurring at edges and other filters are better at reducing blurring at object surfaces away from the edges (e.g., produce fewer noticeable artifacts). As an example, a first filtered image (based on filter particularly suitable for reducing blurring in regions near an object edge) may be blended with the original image for regions near object edges and a second filtered image (based on a filter particularly suitable for reducing blurring in regions away from object edges) may be blended with the original image for other regions. The following blending equation could be used for pixels near an edge of an object in the image:

$$O(i,j)=\alpha(i,j)\cdot F_a(i,j)+(1-\alpha(i,j))\cdot I(i,j)$$

where $F_a(i,j)$ is a filtered image generated using a filter that is suitable for reducing blurring near an object edge. A second equation could be used for pixels that are not near an object edge:

$$O(i,j)=\alpha(i,j)\cdot F_b(i,j)+(1-\alpha(i,j))\cdot I(i,j)$$

where $F_b(i,j)$ is a filtered image generated using a filter that is suitable for reducing blurring away from an object edge. Similarly, the same two equations could be used if different filtered images were to be blended with different portions of the original image. For example, one filter might be used for brighter portions of an image and another filter might be used for darker portions of an image.

Figure 5:
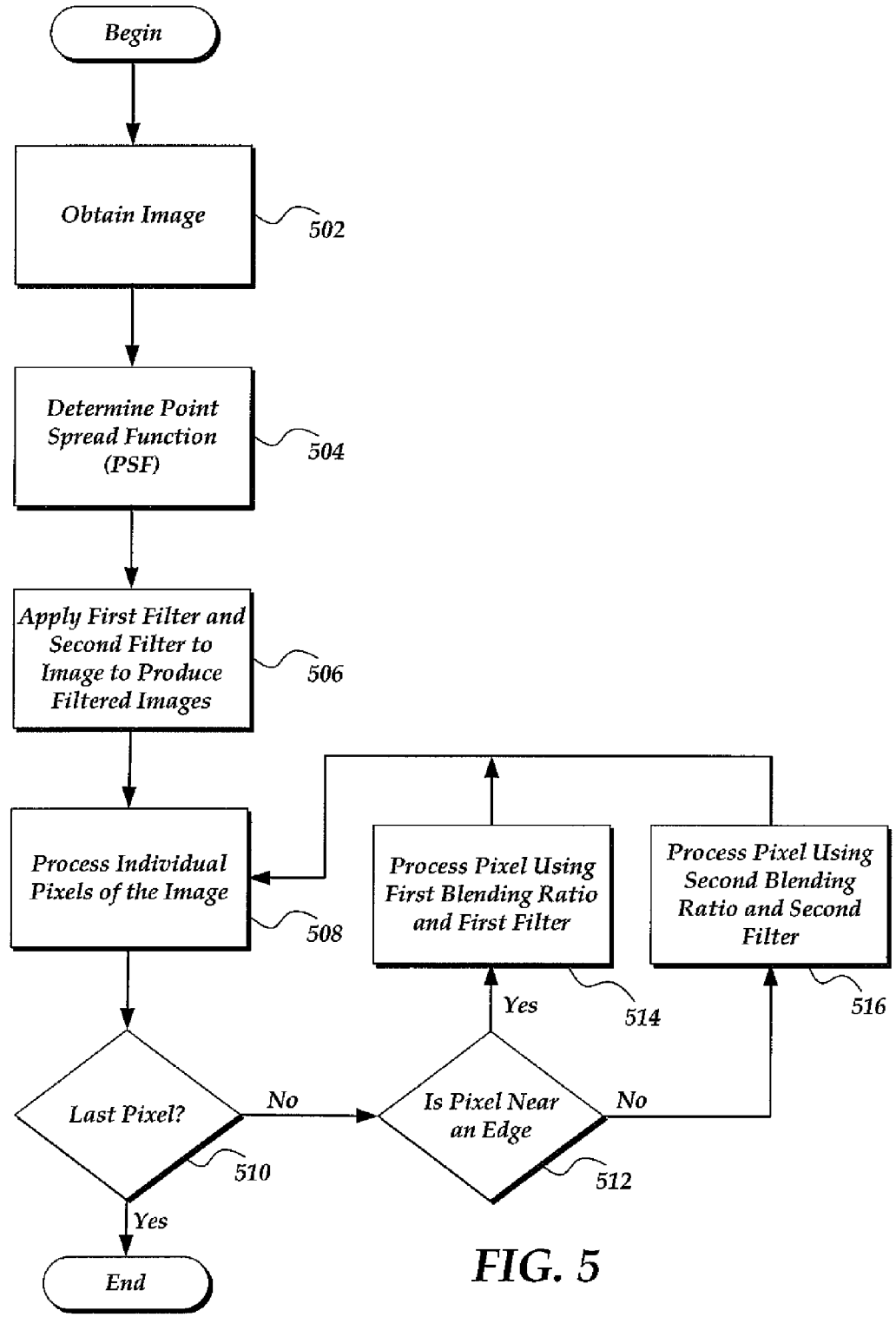
FIG. 5 is a is a flowchart illustrating a fifth embodiment of a method of reducing blurring in an image, according to the invention.

FIG. 5 illustrates one embodiment for blending an original image with two filtered images based on a characteristic of each pixel. In this method, the image is obtained in step 502, a PSF is calculated for the image (or one or more portions of the image) in step 504, and then first and second filters are applied to the image (or one or more portions of the image) based on the PSF to produce filtered images in step 506. The first filtered image is based on a first filter particularly suitable for reducing blurring in regions near an object edge and the second filtered image is based on a second filter particularly suitable for reducing blurring in regions away from object edges. Each pixel of the image is processed in step 508 and it is determined if all the pixels have been processed in step 510. For each pixel, it is determined whether the pixel is near (e.g., within a threshold distance) an edge of an object in step 512. If the pixel is near an edge of an object then the pixel is processed using a first blending ratio to combine the first filtered image and the original image based on the first blending ratio in step 514. If the pixel is not near an edge of an object then the pixel is processed using a second blending ratio to combine the second filtered image and the original image based on the second blending ratio in step 516. The determination of which blending ratio and filtered image are to be used is made for each pixel. Alternatively, the determination can be made collectively for groups of pixels (e.g., pixel neighborhoods.)

It will be understood that each block of the flowchart illustrations, and combinations of blocks in the flowchart illustrations, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks. The computer program instructions may also cause at least some of the operational steps shown in the blocks of the flowchart to be performed in parallel. Moreover, some of the steps may also be performed across more than one processor, such as might arise in a multi-processor computer system. In addition, one or more blocks or combinations of blocks in the flowchart illustration may also be performed concurrently with other blocks or combinations of blocks, or even in a different sequence than illustrated without departing from the scope or spirit of the invention.

Accordingly, blocks of the flowchart illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

The computer program instructions, or portions of the computer program instructions, can be stored on any suitable computer-readable medium including, but not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

Illustrative Camera Device

Figure 6:
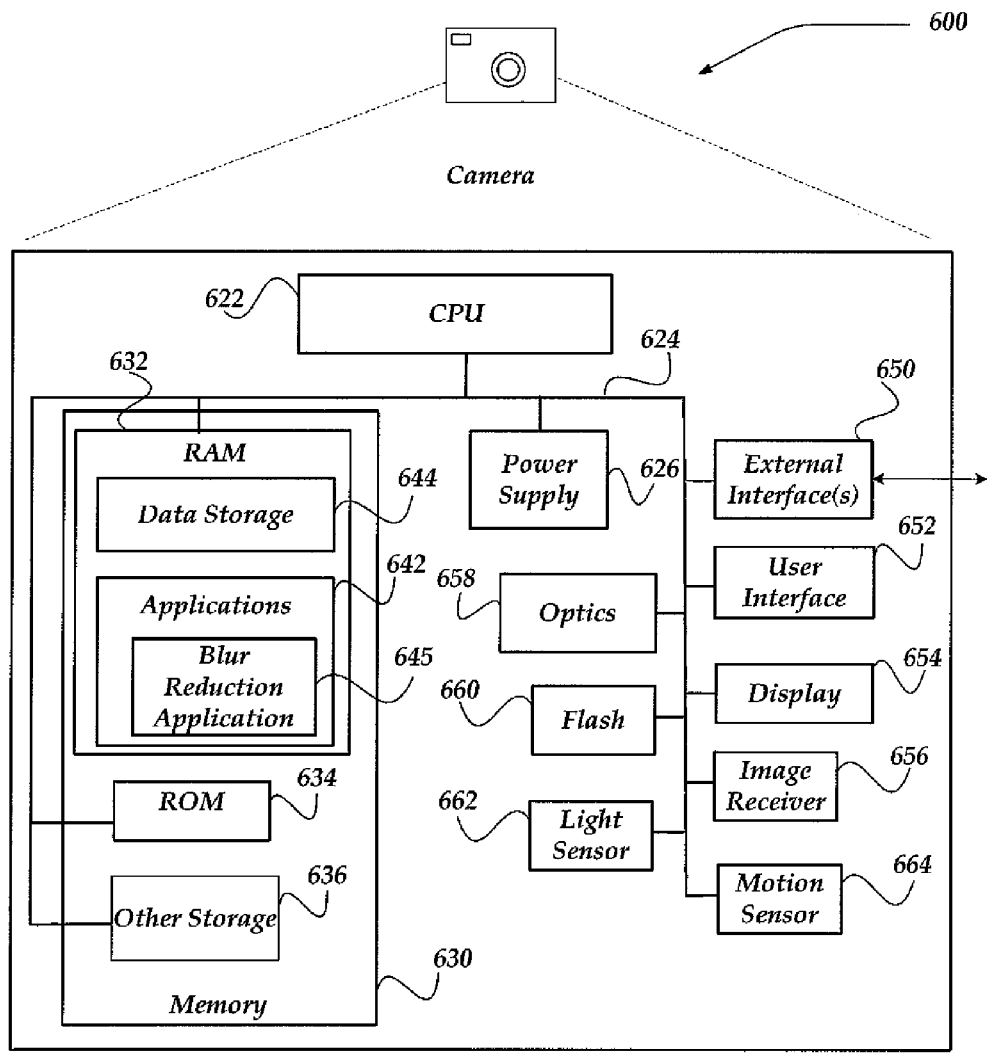
FIG. 6 is a schematic diagram of components of a camera useful for the reducing blurring in an image, according to the invention.

FIG. 6 shows one embodiment of a camera 600 that may be used in implementing the invention. Camera 600 may include more or fewer components than those shown in FIG. 6. However, the components shown are sufficient to disclose an illustrative embodiment for practicing the present invention. It will be understood, however, that the methods described above may be performed by camera 600 or may be performed, entirely or partially, by another device that receive an image captured by camera 600. Moreover, such a device may be used to process images that have been captured by a camera (or other image-capture device) substantially different from the camera illustrated in FIG. 6 including analog cameras that capture images on film. The images can be converted into digital representations by scanning or any other suitable method and can then be processed as described above to reduce blurring of the image. It will also be recognized that the methods described above may also be applied to images that are generated by techniques other than image capture using a camera including computer-generated images.

The camera 600 may be a camera for taking still pictures or motion pictures (e.g., a video camera). The camera 600 may be a stand-alone camera or may be part of a device such as, for example, a mobile phone, PDA, computer, and the like.

As shown in the figure, the camera 600 includes a processing unit (CPU) 622 in communication with a memory 630 via a bus 624. Camera 600 also includes a power supply 626, one or more external interfaces 650, a user interface 652, a display 654, an image receiver 656, optics (e.g., lens(es) and shutter) 658, a flash 660, a light sensor 662, and a motion sensor 664. Power supply 626 provides power to camera 600. A rechargeable or non-rechargeable battery may be used to provide power. The power may also be provided by an external power source, such as an AC adapter.

The optics 658 includes the lens(es), shutter, focusing apparatus, and other optical components that allow the camera to generate an image on the image receiver 656. Any suitable optical arrangement can be used. The image receiver 656 can be any suitable device for receiving the image and generating an electrical representation of the image including, but not limited to, an array of charge-coupled devices (CCD array) or array of CMOS detectors. Preferably, the image receiver generates a digital representation of the image, although it will be understood that analog image receivers can be used and the analog image representation can then be digitized or scanned to generate a digital representation.

The camera 600 may also include a flash 660 to provide additional light when automatically or manually activated. The camera 600 may also include a light sensor 662 to measure the amount of ambient light. The camera 600 may also include a motion sensor 664, such as one or more gyroscopes. The motion sensor 664 may be useful for stabilizing the camera as a picture or video is being taken. The motion sensor may also be useful for later processing, including reducing blurring, of the image as described, for example, above.

The camera 600 typically includes a user interface 652 that allows the user to operate the camera and to change various settings of the camera. The user interface 652 may also allow the user to view images (still or video) on the display 654 of the camera, set parameters related to the capture or processing or images, or send or receive images from the camera.

Camera 600 may optionally communicate with another device, such as a computer or mobile telephone, or with a wired or wireless network. External interface 650 can include a port for coupling the camera 600 to another device or may include circuitry for coupling camera 600 to one or more networks. This circuitry, if provided, may be constructed for use with one or more wired or wireless communication protocols.

Display 654 may be a liquid crystal display (LCD), light emitting diode (LED), or any other type of display. Display 654 may also include a touch sensitive screen arranged to receive input from an object such as a stylus or a digit from a human hand.

Memory 630 typically includes a RAM 632 and a ROM 634 and may include other storage devices. Memory 630 may store processor readable instructions, data structures, program modules or other data. Memory 630 further includes one or more permanent data storage 644, which can be utilized by camera 600 to store, among other things, applications 642, images (still or video), and/or other data. It will be understood that a portion of the memory 636 may be removable from the camera. For example, removable storage memory includes diskettes, memory sticks, memory cards, and the like.

Applications 642 may include computer executable instructions which, when executed by camera 600, control operation of the camera, process images, store images, or transmit or receive images. Applications 642 may further include a blur reduction application 645 as discussed above. In other embodiments, as discussed above, the blur reduction application may be resident on another device.

It will be understood that if the camera is part of another device, such as a mobile phone, PDA, or computer, components of the camera may be shared with other portions of the device. Shared components can include, but are not limited to, for example, the CPU, memory (including RAM, ROM, data storage, other storage, and applications), power supply, external interface(s), user interface, and display.

It will also be recognized that any portion of the methods described herein, including all portions relating to processing of an image, can be performed by a device other than a camera or a camera-containing device. For example, the processing of an image can be performed entirely, or partially, by a separate device such as a computer or the like.

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A method of processing an image, the method comprising:
    obtaining the image;
    determining a point spread function for the image;
    applying a filter, based on the point spread function, to at least a portion of the image to form a filtered image; and
    generating a processed image by blending the filtered image with the image or another filtered image, wherein a first portion of the processed image is generated using a different amount of blending of the filtered image with the image or other filtered image than is used for a second portion of the processed image, wherein the amount of blending for portions of the image that are within a threshold distance of an edge of an object in the image is different from the amount of blending for portions of the image that are not within the threshold distance of an edge of an object in the image.

2. The method of claim 1, wherein obtaining the image comprises obtaining the image using a camera.

3. The method of claim 2, further comprising obtaining motion information about motion of the camera while the image is obtained.

4. The method of claim 3, wherein calculating the point spread function comprises calculating the point spread function using the motion information.

5. The method of claim 1, wherein generating the processed image comprises blending the filtered image with the image.

6. The method of claim 5, further comprising applying a second filter to at least a portion of the image to form a second filtered image, wherein generating a processed image comprises blending the image, the filtered image, and the second filtered image.

7. The method of claim 1, further comprising estimating noise of the image.

8. The method of claim 7, wherein the filter is based, in part, on the estimated noise of the image.

9. The method of claim 7, wherein generating the processed image comprises blending the image with the filtered image based in part on the noise of the image.

10. The method of claim 1, wherein generating the processed image comprises using only the filtered image for portions of the image that are within a threshold distance of an edge of an object in the image.

11. The method of claim 10, wherein using a different ratio of blending comprises using only the image for portions of the image that are not within a threshold distance of an edge of an object in the image.

12. The method of claim 1, wherein generating the processed image comprises using a first amount of blending for pixels of the image for which there is an edge of an object within a predefined neighborhood around the pixel and a second amount of blending, different from the first ratio of blending, for pixels for which there is not an edge of an object within a predefined neighborhood around the pixel.

13. The method of claim 1, applying a non-linear mapping function to at least a portion of the image prior to applying the filter, wherein the non-linear mapping function alters a range of at least one characteristic of pixels in the portion of the image.

14. A device that is operative to process an image, comprising:
    a processor for executing processor-readable instructions that enable actions, including:
    obtaining the image;
    determining a point spread function for the image;
    applying a filter, based on the point spread function, to at least a portion of the image to form a filtered image; and
    generating a processed image by blending the filtered image with the image or another filtered image, wherein a first portion of the processed image is generated using a different amount of blending of the filtered image with the image or other filtered image than a second portion of the processed image, wherein the amount of blending for portions of the image that are within a threshold distance of an edge of an object in the image is different from the amount of blending for portions of the image that are not within the threshold distance of an edge of an object in the image.

15. The device of claim 14, wherein the device is a camera.

16. The device of claim 14, wherein the device is a mobile telephone, personal data assistant, or computer.

17. The device of claim 14, wherein generating the processed image comprises blending the filtered image with the image.

18. The device of claim 17, wherein the actions further include applying a second filter to at least a portion of the image to form a second filtered image, wherein generating a processed image comprises blending the image, the filtered image, and the second filtered image.

19. The device of claim 14, wherein generating the processed image comprises using a first amount of blending for pixels of the image for which there is an edge of an object within a predefined neighborhood around the pixel and a second amount of blending, different from the first ratio of blending, for pixels for which there is not an edge of an object within a predefined neighborhood around the pixel.

20. A computer-readable medium having processor-executable instructions for processing an image, the processor-executable instructions when installed onto a device enable the device to perform actions, comprising:
 obtaining the image;
 determining a point spread function for the image;
 applying a filter, based on the point spread function, to at least a portion of the image to form a filtered image; and
 generating a processed image by blending the filtered image with the image or another filtered image, wherein a first portion of the processed image is generated using a different amount of blending of the filtered image with the image or other filtered image than a second portion of the processed image, wherein the amount of blending for portions of the image that are within a threshold distance of an edge of an object in the image is different from the amount of blending for portions of the image that are not within the threshold distance of an edge of an object in the image.

21. The computer-readable medium of claim 20, wherein generating the processed image comprises blending the filtered image with the image.

22. The computer-readable medium of claim 20, wherein the actions further include applying a second filter to at least a portion of the image to form a second filtered image, wherein generating a processed image comprises blending the image, the filtered image, and the second filtered image.

23. The computer-readable medium of claim 20, wherein generating the processed image comprises using a first amount of blending for pixels of the image for which there is an edge of an object within a predefined neighborhood around the pixel and a second amount of blending, different from the first ratio of blending, for pixels for which there is not an edge of an object within a predefined neighborhood around the pixel.

24. The method of claim 1, further comprising applying a second filter to at least a portion of the image to form a second filtered image, wherein generating a processed image comprises blending together the filtered image with the second filtered image, wherein the first portion of the processed image is generated using a different amount of blending of the filtered image with the second filtered image than a second portion of the processed image.

25. The device of claim 14, wherein the actions further include applying a second filter to at least a portion of the image to form a second filtered image, wherein generating a processed image comprises blending together the filtered image with the second filtered image, wherein the first portion of the processed image is generated using a different amount of blending of the filtered image with the second filtered image than a second portion of the processed image.

26. The computer-readable medium of claim 20, wherein the actions further include applying a second filter to at least a portion of the image to form a second filtered image, wherein generating a processed image comprises blending together the filtered image with the second filtered image, wherein the first portion of the processed image is generated using a different amount of blending of the filtered image with the second filtered image than a second portion of the processed image.

\* \* \* \* \*

UNITED STATES PATENT AND TRADEMARK OFFICE
CERTIFICATE OF CORRECTION

PATENT NO. : 8,098,948 B1
APPLICATION NO. : 12/130733
DATED : January 17, 2012
INVENTOR(S) : Meir Tzur et al.

It is certified that error appears in the above-identified patent and that said Letters Patent is hereby corrected as shown below:

On Page 2, in column 2, line 8, under "Other Publications", delete "Proccessing" and insert -- Processing --, therefor.

On Page 2, in column 2, line 9, under "Other Publications", delete "Fideliy" and insert -- Fidelity --, therefor.

On Page 2, in column 2, line 9, under "Other Publications", delete "Inverer" and insert -- Inverter --, therefor.

On Page 2, in column 2, line 10, under "Other Publications", delete "Amplificaion" and insert -- Amplification --, therefor.

On Page 2, in column 2, line 10, under "Other Publications", delete "Univesiy" and insert -- University --, therefor.

In column 6, line 19, delete "a the" and insert -- the --, therefor.

In column 8, line 40, delete "$F_i(i,j)$" and insert -- $F_1(i,j)$ --, therefor.

Signed and Sealed this
Twenty-fourth Day of April, 2012

David J. Kappos
*Director of the United States Patent and Trademark Office*